(12) United States Patent
Lin et al.

(10) Patent No.: US 8,288,761 B2
(45) Date of Patent: Oct. 16, 2012

(54) COMPOSITION FOR PHOTOSENSITIVE ORGANIC DIELECTRIC MATERIAL AND APPLICATION THEREOF

(75) Inventors: Mei-Ru Lin, Changhua County (TW);
Jing-Yi Yan, Taoyuan County (TW);
Liang-Hsiang Chen, Taichung (TW);
Chin-Lung Liao, Tainan County (TW)

(73) Assignee: Industrial Technology Research Institute, Hsinchu (TW)

( * ) Notice: Subject to any disclaimer, the term of this patent is extended or adjusted under 35 U.S.C. 154(b) by 631 days.

(21) Appl. No.: 12/426,295

(22) Filed: Apr. 20, 2009

(65) Prior Publication Data

US 2010/0084636 A1 Apr. 8, 2010

(30) Foreign Application Priority Data

Oct. 2, 2008 (TW) ................................ 97137953 A

(51) Int. Cl.
*H01L 35/24* (2006.01)

(52) U.S. Cl. ................... 257/40; 257/E51.001; 525/219; 524/74

(58) Field of Classification Search ..................... 257/40, 257/E51.001; 525/219; 524/74
See application file for complete search history.

(56) References Cited

U.S. PATENT DOCUMENTS

2006/0145149 A1* 7/2006 Halik et al. ...................... 257/40
2006/0202198 A1* 9/2006 Halik et al. ...................... 257/40
2008/0315192 A1* 12/2008 Halik et al. ...................... 257/40

* cited by examiner

*Primary Examiner* — Anthony Ho
(74) *Attorney, Agent, or Firm* — Jianq Chyun IP Office

(57) ABSTRACT

A composition for photosensitive dielectric material is provided. The composition includes 4 to 10 percent by weight of a polymer material, 1.5 to 10 percent by weight of a crosslinking agent, 0.32 to 2 percent by weight of a photoacid generator (PAG) and 78 to 94.18 percent by weight of solvent, based on a total weight of the composition.

18 Claims, 3 Drawing Sheets

COMPOSITION FOR PHOTOSENSITIVE ORGANIC DIELECTRIC MATERIAL AND APPLICATION THEREOF

CROSS-REFERENCE TO RELATED APPLICATION

This application claims the priority benefit of Taiwan application serial no. 97137953, filed on Oct. 2, 2008. The entirety of the above-mentioned patent application is hereby incorporated by reference herein and made a part of specification.

BACKGROUND OF THE INVENTION

1. Field if the Invention

The present invention relates to a composition for, a photosensitive organic dielectric material, and a structure of metal layer-insulating layer-metal layer formed and a transistor both constituted by the composition.

2. Description of Related Art

During the process of developing organic thin film transistor (OTFT) technology, shift to organic materials, improvement on expensive processes, and achievement of flexibility are set as goals. Due to the characteristics of flexibility of the OTFT, the OTFT have the advantages of impact endurance, light weight, and small volume. This breakthrough in the development of OTFT not only changes the appearance of the product, but also significantly expands the application of OTFT to a greater variety of environments and renders the application more diversified.

The research and development of OTFT has moved towards developing organic materials with satisfactory performance and advanced fabricating technology to manufacture OTFT devices with superior characteristics. Nowadays, gate organic dielectric materials are all patterned by a dry etching process, and thus disadvantages, such as process complexity and high fabrication costs, tend to arise. Therefore, patterning gate organic dielectric materials by a wet etching process is currently an important research focus.

SUMMARY OF THE INVENTION

Embodiments disclosed, herein may provide a composition for a photosensitive organic dielectric material. The composition includes 4-10 percent by weight of a polymer material, 1.5-10 percent by weight of a crosslinking agent, 0.32-2 percent by weight of a photoacid generator (PAG) and 78-94.18 percent by weight of a solvent based on a total weight of the composition for the photosensitive organic dielectric material.

Embodiments disclosed herein may provide a structure of metal layer-insulating layer-metal layer. A composition for forming a photosensitive organic dielectric material is polymerized through irradiation to form the insulating layer. The composition for forming the photosensitive organic dielectric material includes 4-10 percent by weight of a polymer material, 1.5-10 percent by weight of a crosslinking agent, 0.32-2 percent by weight of a photoacid generator, and 78-94.18 percent by weight of a solvent based on a total weight of the composition for the photosensitive organic dielectric material.

Embodiments disclosed herein may provide an organic thin film transistor (OTFT) including a gate, a gate dielectric layer, a source, a drain, and an active layer. The gate is disposed on a substrate. The gate dielectric layer covers the gate, and a composition for a photosensitive organic dielectric material is polymerized through irradiation to form the gate dielectric layer. The composition for the photosensitive organic dielectric material includes 4-10 percent by weight of a polymer material, 1.5-10 percent by weight of a crosslinking agent, 0.32-2 percent by weight of a photoacid generator, and 78-94.18 percent by weight of a solvent based on a total weight of the composition for the photosensitive organic dielectric material. The source and the drain are disposed on the gate dielectric layer at two sides of the gate. The active layer covers the gate dielectric layer on the gate and is disposed between the source and the drain.

In order to the make aforementioned and other objects, features and advantages of the present invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
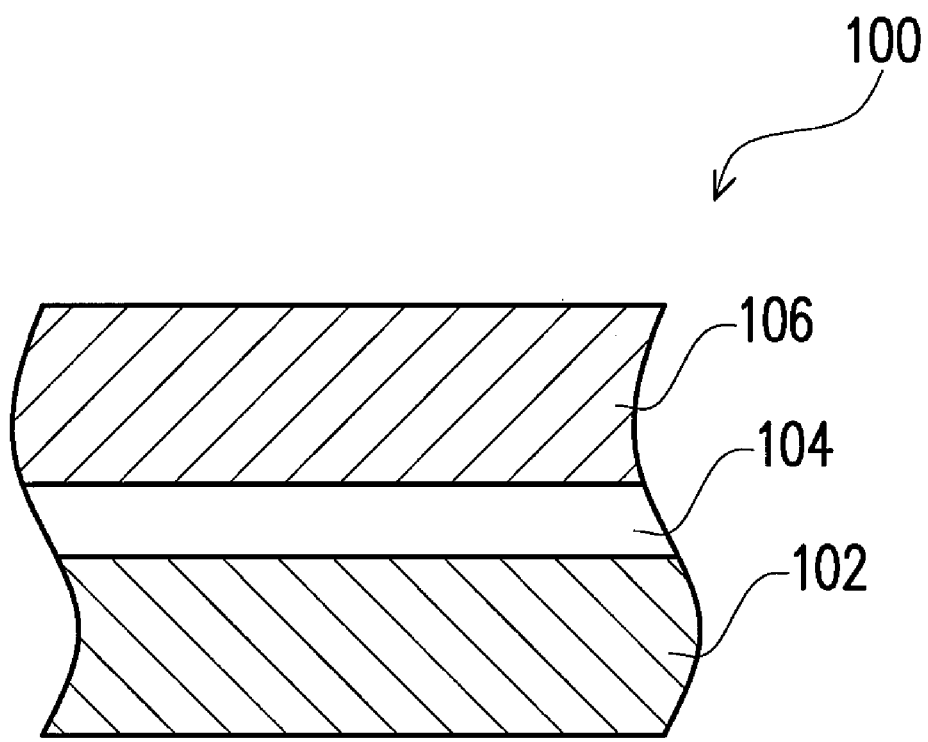
FIG. 1 is a schematic view of a structure of metal layer-insulating layer-metal layer.

Embodiments disclosed herein may provide a composition for a photosensitive organic dielectric material. A low-temperature process can be adopted to form a thin film, and the formed thin film has a high carrier mobility. Moreover, embodiments disclosed herein may provide a composition for a photosensitive organic dielectric material, and the composition can be patterned by performing a wet developing process so as to simplify the process. In addition, embodiments disclosed herein may provide a composition for a photosensitive organic dielectric material, and the composition can be applied to integration and large area process so as to reduce fabrication costs of devices.

According to an embodiment of the present invention, a composition for a photosensitive organic dielectric material includes a polymer material, a crosslinking agent, a photoacid generator (PAG), and a solvent. According to an embodiment, respective percentages by weight of each ingredient in the composition for the photosensitive organic dielectric material are: 4-10 percent by weight of the polymer material, 1.5-10 percent by weight of the crosslinking agent, 0.32-2 percent by weight of the photoacid generator, and 78-94.18 percent by weight of the solvent. According to another embodiment, respective percentages by weight of each component in the composition for the photosensitive organic dielectric material are: 7 percent by weight of the polymer material, 5.3 percent by weight of the crosslinking agent, 0.64 percent by weight of the photoacid generator, and 87.06 percent by weight of the solvent. According to still another embodiment, respective percentages by weight of each ingredient in the composition for forming the photosensitive organic dielectric material are: 4 percent by weight of the polymer material, 6.31 percent by weight of the crosslinking agent, 0.64 percent by weight of the photoacid generator, and 89.05 percent by weight of the solvent.

The polymer material is selected from a group consisting of polyvinyl phenol (PVA), whose structure is shown below:

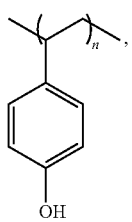

derivatives thereof or a combination thereof. A molecular weight of polyvinyl phenol (PVA) can be 2000-40000. In the composition for forming the photosensitive organic dielectric material, a percentage of the polymer material can be 4-10 percent by weight. When the percentage of the polymer material is too high, a film thickness becomes too thick. Consequently, during operation, a smaller electric field is produced, and a higher voltage is required for operation. When the percentage of the polymer material is too low, the film thickness becomes too thin and tends to be uneven such that leakage current may occur during operation.

The crosslinking agent is selected from a group consisting of 2,4,6-tris[bis(methoxymethyl)amino]-1,3,5-triazine, whose structure is shown below:

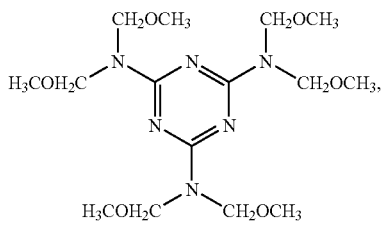

hexa methoxymethyl melamine-formaldehyde, or a combination thereof. In the composition for the photosensitive organic dielectric material, a percentage of the crosslinking agent can be 1.5-10 percent by weight. When the percentage of the crosslinking agent is too high, a crosslinking density becomes too high such that the formed thin film gets so rigid that it cracks easily, resulting in leakage current. When the percentage of the crosslinking agent is too low, a crosslinking density is insufficient such that leakage current occurs due to insufficient strength to withstand high voltages.

The photoacid generator includes:

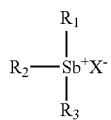

$R_1$, $R_2$ and $R_3$ can be completely identical, partially identical or completely different, and they may respectively be a straight chain or a branched chain of alkyl group of C1-C4, arylene group, or arakyl group. X is a halogen, e.g., fluorine or chlorine. In the composition for the photosensitive organic dielectric material, a percentage of the photoacid generator can be 0.32-2 percent by weight. When the percentage of the photoacid generator is too high, so many ions are produced that a density of leakage current increases. When the percentage of the photoacid generator is too low, generated photoacid is insufficient such that an exposure process cannot be carried out to achieve perfectly developed patterns.

The solvent is selected from a group consisting of propylene glycol monomethyl ether acetate (PGMEA), whose structure is shown below:

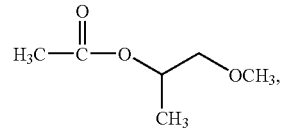

isopropanol (IPA), dimethylformamide (DMF), or a combination thereof. In the composition for the photosensitive organic dielectric material, a percentage of the solvent can be 78-94.18 percent by weight. When the percentage of the solvent is too high, a concentration of the solvent becomes so low that the thickness of the formed thin film is too thin to be even. When the percentage of the solvent is too low, the concentration of the solvent becomes so high that the thickness of the formed film is too thick.

An irradiation is performed, and then the composition for the photosensitive organic dielectric material is crosslinked and polymerized so as to form the dielectric layer. The dielectric layer can be applied to a field effect transistor and a thin film transistor (TFT) as a gate dielectric layer. Alternatively, the dielectric layer can be applied to the insulating layer in the structure of metal layer-insulating layer-metal layer, such as a dielectric layer between two electrodes in a capacitor, but is not limited thereto. A description of an embodiment exemplified by a structure of metal layer-insulating layer-metal layer (MIM) and an organic thin film transistor (OTFT) is provided in the following.

FIG. 1 is a schematic view of a structure of metal layer-insulating layer-metal layer. Materials of two metal layers 102 and 106 in an MIM structure 100 can be identical or different. The material of the metal layer 102 includes gold (Au), silver (Ag), aluminum (Al), copper (Cu), chromium (Cr) or a transparent conductive oxide, e.g., indium tin oxide (ITO). The material of the metal layer 106 may include Au, Ag, Al, Cu, Cr or a transparent conductive oxide, e.g., ITO. An insulating layer 104 is formed by polymerizing the composition for the photosensitive organic dielectric material of the present invention through irradiation.

Figure 2:
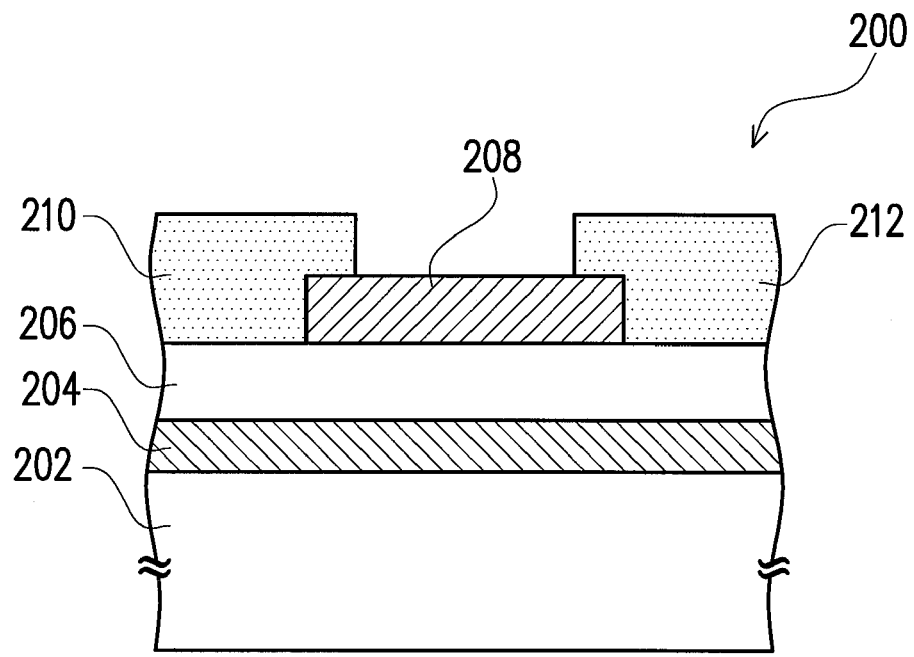
FIG. 2 is a schematic view of a top contact type OTFT structure.
Figure 3:
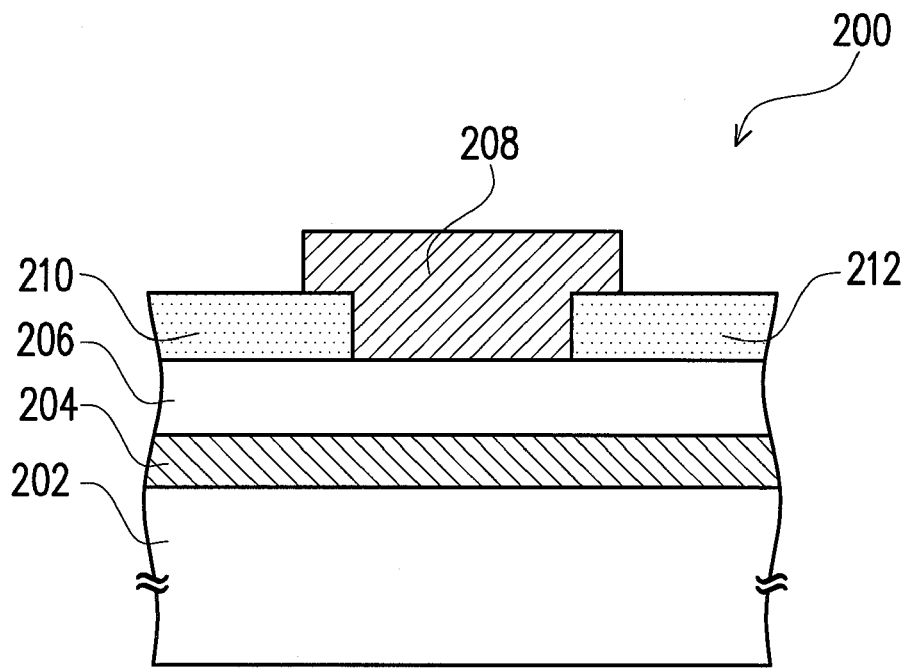
FIG. 3 is a schematic view of a bottom contact type OTFT structure.

FIG. 2 is a schematic view of a top contact type OTFT structure. FIG. 3 is a schematic view of a bottom contact type OTFT structure.

Referring to FIGS. 2 and 3, an OTFT 200 of the present invention has a gate 204, a gate dielectric layer 206, a source 210, a drain 212 and an active layer 208. The gate 204 can be disposed on a substrate 202, and the gate dielectric layer 206 covers the gate 204. The source 210 and the drain 212 are disposed on the gate dielectric layer 206 at two sides of the gate 204. In FIG. 2, the active layer 208 is disposed over the gate 204 and under the source 210 and the drain 212. In FIG. 3, the active layer 208 is disposed over the gate 204 and between the source 210 and the drain 212 and extends to cover upper portions of the source 210 and the drain 212.

A material of the substrate 202 is, for example, glass, plastic, metal or other suitable materials. The material of the gate 204 is, for example, metal, e.g., Au, Ag, Al, Cu, Cr, or a transparent conductive oxide, such as ITO. The material of the gate dielectric layer 206 is formed by polymerizing the composition for the photosensitive organic dielectric material through irradiation. The materials of the source 210 and the drain 212 include metal, e.g., Au, Ag, Al, Cu, Cr, or transparent conductive oxides, e.g., ITO. The material of the active layer 208 is, for example, pentacene, poly-(3-hexylthiophene) (P3HT), or tetracene.

According to an embodiment, a manufacturing method of said OTFT includes first forming a gate 204 on a substrate 202 and then manufacturing a gate dielectric layer 206 with the composition of the present invention.

A method for manufacturing the gate dielectric layer 206 may include first coating the composition for forming the photosensitive organic dielectric material on the substrate 202 according to the foregoing embodiment of the present invention. Afterwards, a baking process is performed to form a dielectric material layer. Finally, an exposure process and a developing process are performed to form the gate dielectric layer 206. A coating method is spin coating, dip coating, or spray, for example. The baking process includes first performing a soft baking process at low temperature followed by a hard baking process at a higher temperature. The temperatures of the soft baking process and the hard baking process are related to the kind of solvent in the composition. The temperature for the soft baking process can be between a room temperature and 150° C., between the room temperature and 130° C., or between 50° C. and 100° C. The temperature for the hard baking process can be between the room temperature and 300° C., between the room temperature and 200° C., or between 50° C. and 180° C. The dielectric material layer is formed with the composition for the photosensitive organic dielectric material, and therefore no photoresist layer is required to transfer a pattern during a patterning process. Instead, an exposure process and a developing process are performed directly to complete fabrication of the patterned gate dielectric layer 206. More specifically, a patterning method includes first performing an exposure process by using a photomask as a mask and without forming any photoresist layer on the dielectric material layer, for example. After the exposure process, an area in the dielectric material layer not yet exposed is formed as an unexposed region, and an exposed area in the dielectric material layer is crosslinked and polymerized to form an exposed region. Next, a developing process is performed to remove a dielectric material in the unexposed region of the dielectric material layer, leaving the remaining exposed region to form the gate dielectric layer 206. A light source used in the exposure process is a mercury lamp, for example. An exposure intensity is, for example, 100-400 mJ/cm². A developer solution used for the developing process is a water solution of tetra methyl ammonium hydroxide (TMAH) or a water solution of potassium hydroxide (KOH). Alternatively, the composition of the present invention may also be formed on the substrate 202 by direct patterning. Then, an irradiating process is performed followed by a baking process to polymerize the composition so as to form the gate dielectric layer 206. The method for direct patterning includes, for example, slot die coating, flexographic coating, inkjet printing, microcontact printing, nanoimprinting, or screen printing.

Thereafter, the patterned active layer 208, the source 210, and the drain 212 are further formed to accomplish the top contact type OTFT shown by FIG. 2, or the bottom contact type OTFT shown by FIG. 3.

Figure 4A:
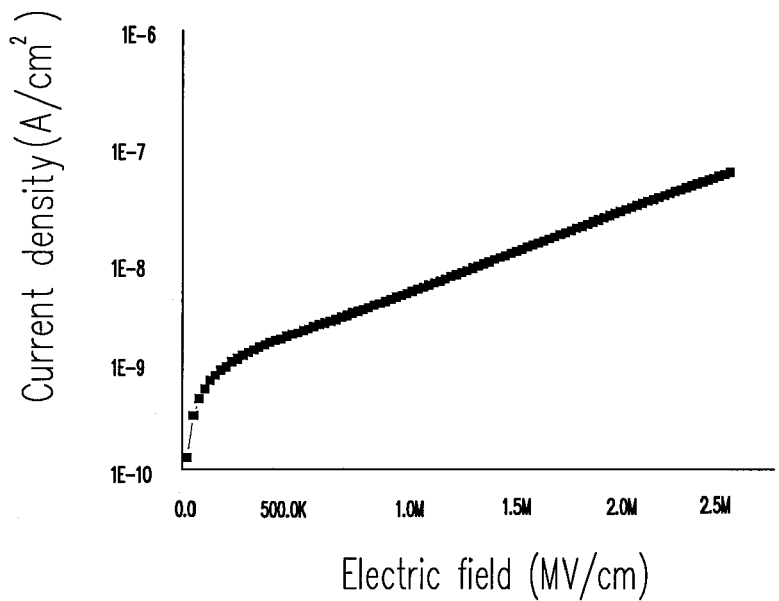
FIGS. 4A and 4B are electrical characteristic diagrams of a top contact type OTFT according to an embodiment of the present invention respectively.
Figure 4B:
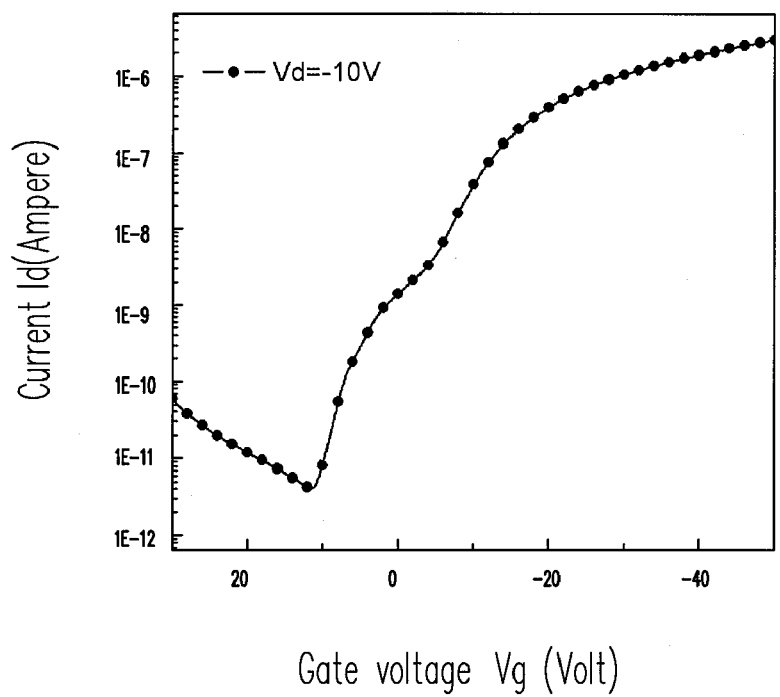

FIGS. 4A and 4B are electrical characteristic diagrams of a top contact type OTFT according to an embodiment of the present invention respectively. In FIG. 4A, the ordinate represents a density of leakage current, and the abscissa represents an electric field intensity. The curve shows a relationship between a gate of the OTFT supplied with different voltages and the density of leakage current. In FIG. 4B, Vg represents a voltage applied to the gate; Id represents a corresponding current generated by a drain of the OTFT, and a curve shows the relationship between the voltage applied to the gate of the OTFT and the corresponding current generated by the drain of the OTFT.

It is known from the conversion between FIGS. 4A and 4B that an electron mobility rate of the top contact type OTFT in the present embodiment is 0.66 cm²/V·s, and the density of leakage current is $2 \times 10^{-8}$ A/cm² under the electric field of 2MV/cm.

Embodiments disclosed herein may provide a composition for a photosensitive organic dielectric material. The composition is patterned by a wet developing process to form a gate organic dielectric layer so as to simplify the process. Furthermore, the composition for the photosensitive organic dielectric material has an extremely low density of leakage current. Besides, when applied to top contact type OTFT devices, the photosensitive organic dielectric material also has satisfactory carrier mobility, and the process is suitable to be carried out at low temperature. Therefore, embodiments disclosed herein may provide not only has advantages such as implementation at low temperature and simplified process but is also applicable to device integration and mass production and thereby reducing the fabrication costs of the devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A composition for a photosensitive organic dielectric material, comprising:
    4-10 percent by weight of a polymer material;
    1.5-10 percent by weight of a crosslinking agent, wherein the crosslinking agent is selected from the group consisting of 2,4,6-tris[bis(methoxymethyl)amino]-1,3,5-triazine, whose structure is shown below:

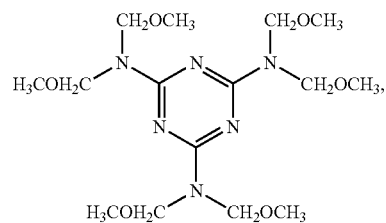

hexa methoxymethyl melamine-formaldehyde, or a combination thereof;
    0.32-2 percent by weight of a photoacid generator; and
    78-94.18 percent by weight of a solvent based on a total weight of the composition for the photosensitive organic dielectric material.

2. The composition for the photosensitive organic dielectric material of claim 1, wherein the polymer material is selected from the group consisting of polyvinyl phenol, whose structure is shown below:

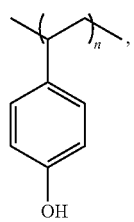

derivatives thereof or a combination thereof.

3. The composition for the photosensitive organic dielectric material of claim 1, wherein the solvent is selected from the group consisting of propylene glycol monomethyl ether acetate (PGMEA), whose structure is shown below:

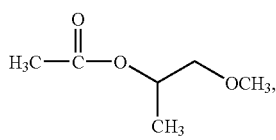

isopropanol (IPA), dimethylformamide (DMF), or a combination thereof.

4. A composition for the photosensitive organic dielectric material, comprising:
   4-10 percent by weight of a polymer material;
   1.5-10 percent by weight of a crosslinking agent,
   0.32-2 percent by weight of a photoacid generator, wherein the photoacid generator comprises:

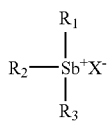

wherein
   $R_1$, $R_2$ and $R_3$ are completely identical, partially identical or completely different, they are respectively a straight chain or a branched chain of alkyl group of C1-C4, arylene group, or arakyl group, and X is a halogen; and
   78-94.18 percent by weight of a solvent based on a total weight of the composition for the photosensitive organic dielectric material.

5. The composition for the photosensitive organic dielectric material of claim 4, wherein the polymer material is selected from the group consisting of polyvinyl phenol, whose structure is shown below:

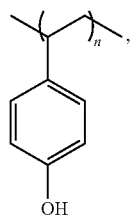

derivatives thereof or a combination thereof.

6. The composition for the photosensitive organic dielectric material of claim 4, wherein the solvent is selected from the group consisting of propylene glycol monomethyl ether acetate (PGMEA), whose structure is shown below:

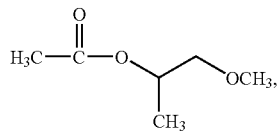

isopropanol (IPA), dimethylformamide (DMF), or a combination thereof.

7. A structure of metal layer-insulating layer-metal layer (MIM), wherein the insulating layer is formed by polymerizing a composition for a photosensitive organic dielectric material through irradiation, and the composition for the photosensitive organic dielectric material comprises:
   4-10 percent by weight of a polymer material;
   1.5-10 percent by weight of a crosslinking agent, wherein the crosslinking agent is selected from the group consisting of 2,4,6-tris[bis(methoxymethyl)amino]-1,3,5-triazine, whose structure is shown below:

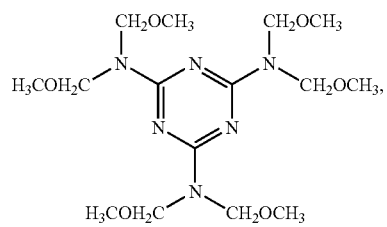

hexa methoxymethyl melamine-formaldehyde, or a combination thereof;
   0.32-2 percent by weight of a photoacid generator; and
   78-94.18 percent by weight of a solvent based on a total weight of the composition for the photosensitive organic dielectric material.

8. The structure of MIM of claim 7, wherein the polymer material is selected from the group consisting of polyvinyl phenol, whose structure is shown below:

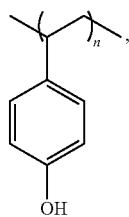

derivatives thereof or a combination thereof.

9. The structure of MIM of claim 7, wherein the solvent is selected from the group consisting of propylene glycol monomethyl ether acetate (PGMEA), whose structure is shown below:

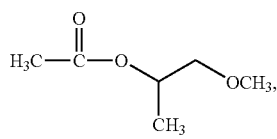

isopropanol (IPA), dimethylformamide (DMF), or a combination thereof.

10. A structure of metal layer-insulating layer-metal layer (MIM), wherein the insulating layer is formed by polymerizing a composition for a photosensitive organic dielectric material through irradiation, and the composition for the photosensitive organic dielectric material comprises:
- 4-10 percent by weight of a polymer material;
- 1.5-10 percent by weight of a crosslinking agent;
- 0.32-2 percent by weight of a photoacid generator, wherein the photoacid generator comprises:

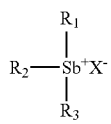

wherein
$R_1$, $R_2$ and $R_3$ are completely identical, partially identical or completely different, they are respectively a straight chain or a branched chain of alkyl group of C1-C4, arylene group, or arakyl group, and X is a halogen; and
78-94.18 percent by weight of a solvent based on a total weight of the composition for the photosensitive organic dielectric material.

11. The structure of MIM of claim 10, wherein the polymer material is selected from the group consisting of polyvinyl phenol, whose structure is shown below:

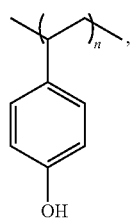

derivatives thereof or a combination thereof.

12. The structure of MIM of claim 10, wherein the solvent is selected from the group consisting of propylene glycol monomethyl ether acetate (PGMEA), whose structure is shown below:

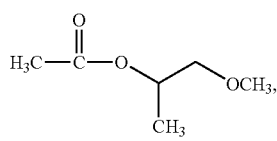

isopropanol (IPA), dimethylformamide (DMF), or a combination thereof.

13. An organic thin film transistor (OTFT), comprising:
a gate, disposed on a substrate;
a gate dielectric layer, covering the gate;
a source and a drain, disposed on the gate dielectric layer at two sides of the gate;
an active layer, covering the gate dielectric layer on the gate and disposed between the source and the drain,
wherein the gate dielectric layer is formed by polymerizing a composition for a photosensitive organic dielectric material through irradiation, the composition for the photosensitive organic dielectric material comprises:
4-10 percent by weight of a polymer material;
1.5-10 percent by weight of a crosslinking agent, wherein the crosslinking agent is selected from the group consisting of 2,4,6-tris[bis(methoxymethyl)amino]-1,3,5-triazine, whose structure is shown below:

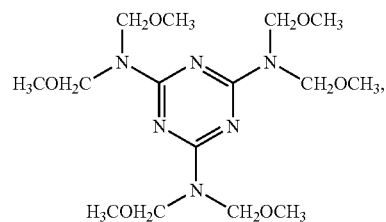

hexa methoxymethyl melamine-formaldehyde, or a combination thereof;
0.32-2 percent by weight of a photoacid generator; and
78-94.18 percent by weight of a solvent based on a total weight of the composition for the photosensitive organic dielectric material.

14. The OTFT of claim 13, wherein the polymer material is selected from the group consisting of polyvinyl phenol, whose structure is shown below:

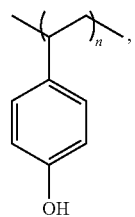

derivatives thereof or a combination thereof.

15. The OTFT of claim 13, wherein the solvent is selected from the group consisting of propylene glycol monomethyl ether acetate (PGMEA), whose structure is shown below:

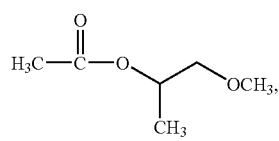

isopropanol (IPA), dimethylformamide (DMF), or a combination thereof.

16. An organic thin film transistor (OTFT), comprising:
a gate, disposed on a substrate;
a gate dielectric layer, covering the gate;
a source and a drain, disposed on the gate dielectric layer at two sides of the gate;

an active layer, covering the gate dielectric layer on the gate and disposed between the source and the drain,
wherein the gate dielectric layer is formed by polymerizing a composition for a photosensitive organic dielectric material through irradiation, the composition for the photosensitive organic dielectric material comprises:
4-10 percent by weight of a polymer material;
1.5-10 percent by weight of a crosslinking agent;
0.32-2 percent by weight of a photoacid generator, wherein the photoacid generator comprises:

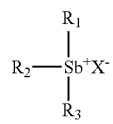

wherein
$R_1$, $R_2$ and $R_3$ are completely identical, partially identical or completely different, they are respectively a straight chain or a branched chain of alkyl group of C1-C4, arylene group, or arakyl group, and X is a halogen; and
78-94.18 percent by weight of a solvent based on a total weight of the composition for the photosensitive organic dielectric material.

17. The OTFT of claim 16, wherein the polymer material is selected from the group consisting of polyvinyl phenol, whose structure is shown below:

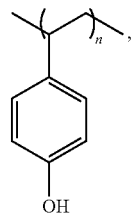

derivatives thereof or a combination thereof.

18. The OTFT of claim 16, wherein the solvent is selected from the group consisting of propylene glycol monomethyl ether acetate (PGMEA), whose structure is shown below:

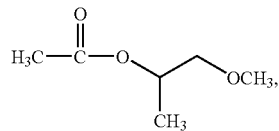

isopropanol (IPA), dimethylformamide (DMF), or a combination thereof.

* * * * *